United States Patent
Messer et al.

(10) Patent No.: US 12,191,202 B2
(45) Date of Patent: Jan. 7, 2025

(54) CONTACT OPENINGS IN SEMICONDUCTOR DEVICES

(71) Applicant: Tokyo Electron Limited, Tokyo (JP)

(72) Inventors: Blaze Messer, Albany, NY (US); Andrew Metz, Albany, NY (US)

(73) Assignee: Tokyo Electron Limited, Toyko (JP)

(*) Notice: Subject to any disclaimer, the term of this patent is extended or adjusted under 35 U.S.C. 154(b) by 258 days.

(21) Appl. No.: 17/321,041

(22) Filed: May 14, 2021

(65) Prior Publication Data

US 2021/0358807 A1 Nov. 18, 2021

Related U.S. Application Data

(60) Provisional application No. 63/025,531, filed on May 15, 2020.

(51) Int. Cl.
| | |
|---|---|
| *H01L 21/768* | (2006.01) |
| *H01L 21/311* | (2006.01) |
| *H01L 21/67* | (2006.01) |

(52) U.S. Cl.
CPC .. *H01L 21/76897* (2013.01); *H01L 21/31122* (2013.01); *H01L 21/67069* (2013.01); *H01L 21/76816* (2013.01); *H01L 21/76831* (2013.01)

(58) Field of Classification Search
CPC ......... H01L 21/76897; H01L 21/31122; H01L 21/67069; H01L 21/76816; H01L 21/76831; H01L 21/76834; H01L 2221/1063; H01L 21/32136; H01L 21/31116; H01J 37/32
See application file for complete search history.

(56) References Cited

U.S. PATENT DOCUMENTS

| | | | |
|---|---|---|---|
| 7,622,051 B1 * | 11/2009 | Schaefer | H01L 21/32137 216/74 |
| 2014/0077305 A1 * | 3/2014 | Pethe | H01L 21/76807 257/E21.409 |
| 2014/0103458 A1 | 4/2014 | Dewey et al. | |
| 2018/0240667 A1 * | 8/2018 | Yu | H01L 21/32139 |
| 2018/0261510 A1 * | 9/2018 | Qiu | H01L 21/76897 |
| 2020/0083044 A1 * | 3/2020 | Yu | H01L 21/0332 |
| 2020/0119152 A1 * | 4/2020 | Wang | H01L 21/76897 |

OTHER PUBLICATIONS

Fracassi et al., "Chemistry of titanium dry etching in fluorinated and chlorinated gases", Pure & Appl. Chem., vol. 64, No. 5, pp. 703-707, 1992, Bari, Italy, 5 pages total.

* cited by examiner

*Primary Examiner* — Fernando L Toledo
*Assistant Examiner* — Jahae Kim
(74) *Attorney, Agent, or Firm* — Slater Matsil, LLP

(57) ABSTRACT

In certain embodiments, a method for processing a semiconductor substrate includes receiving a semiconductor substrate that includes a nitride etch stop layer aligned to a gate electrode and a metal-based etch stop layer aligned to a source/drain contact region. The method further includes selectively etching the metal-based etch stop layer, to remove the metal-based etch stop layer and expose a surface of the source/drain contact region, by exposing the semiconductor substrate to a plasma formed in a gas comprising a corrosive material and fluorocarbon.

20 Claims, 8 Drawing Sheets

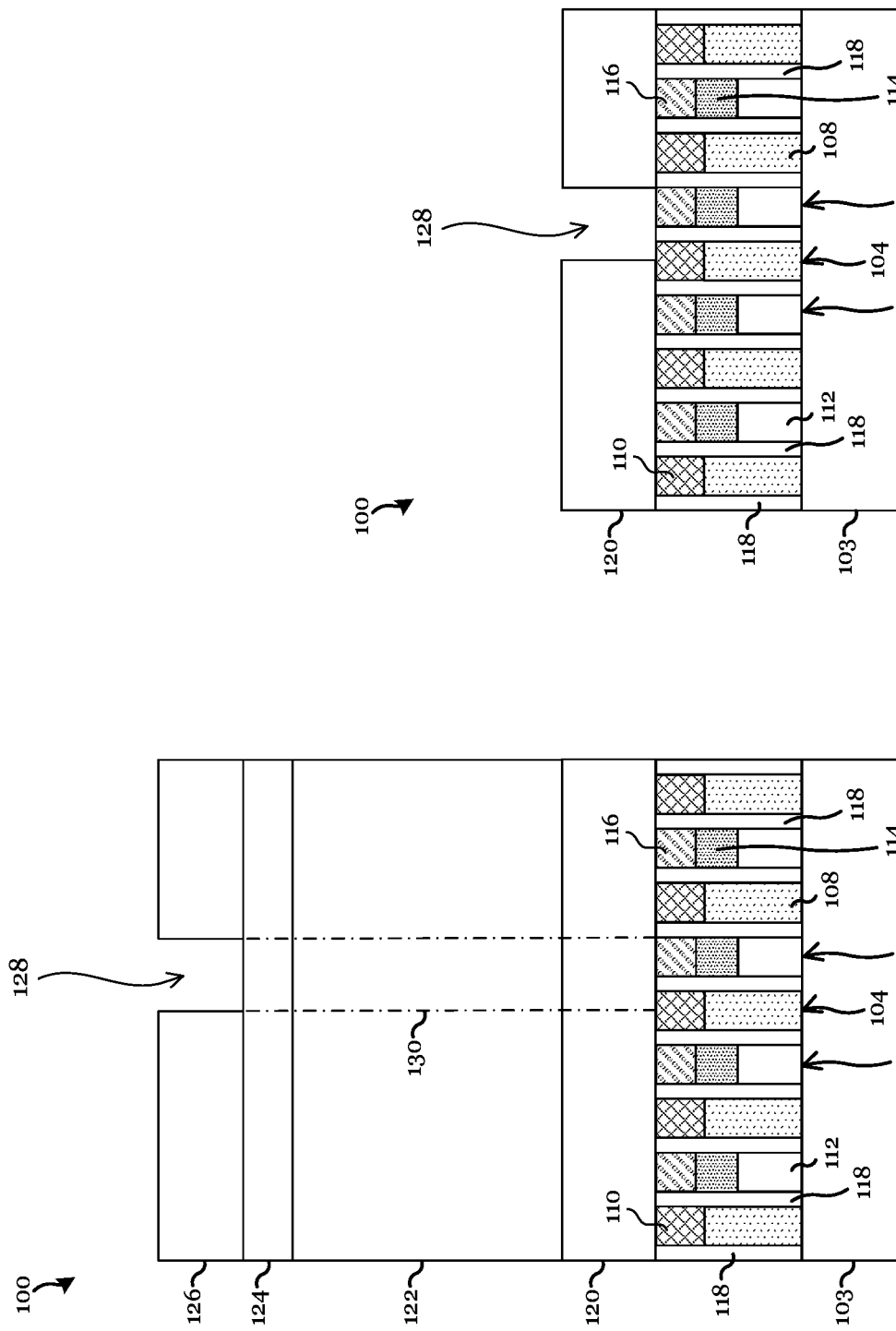

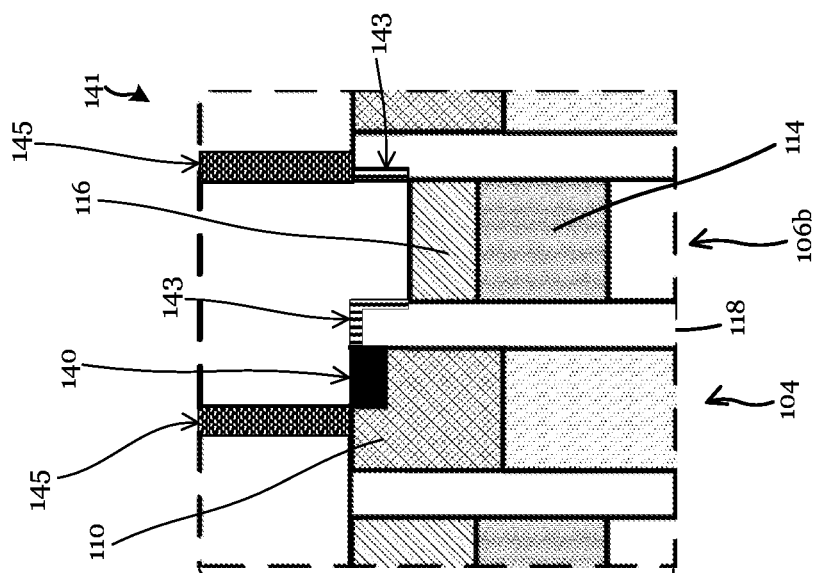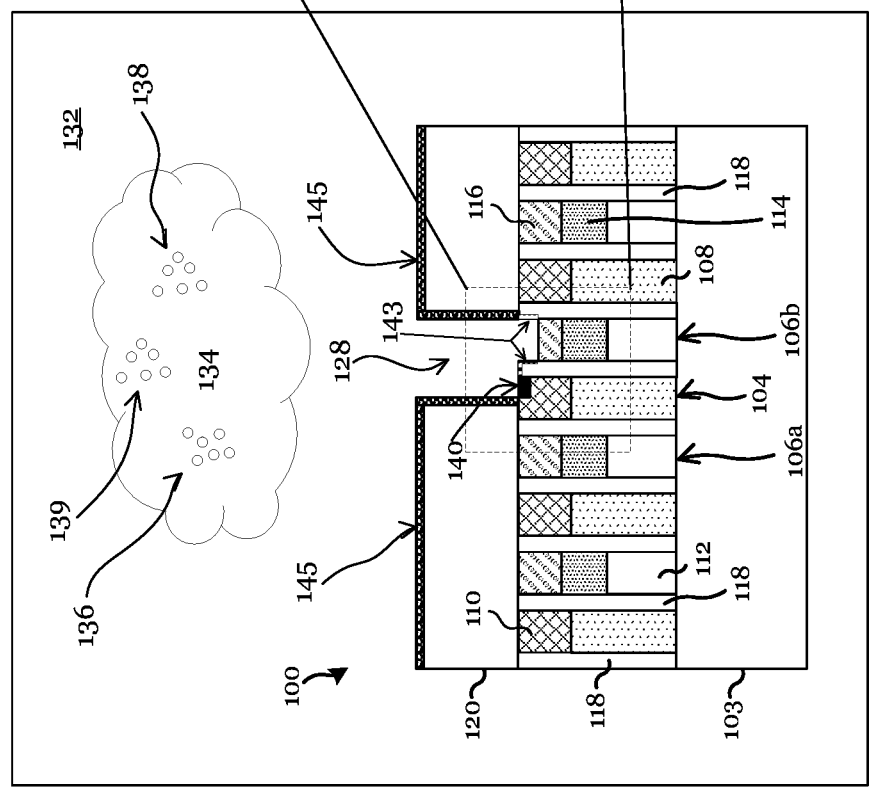
FIGURE 1C

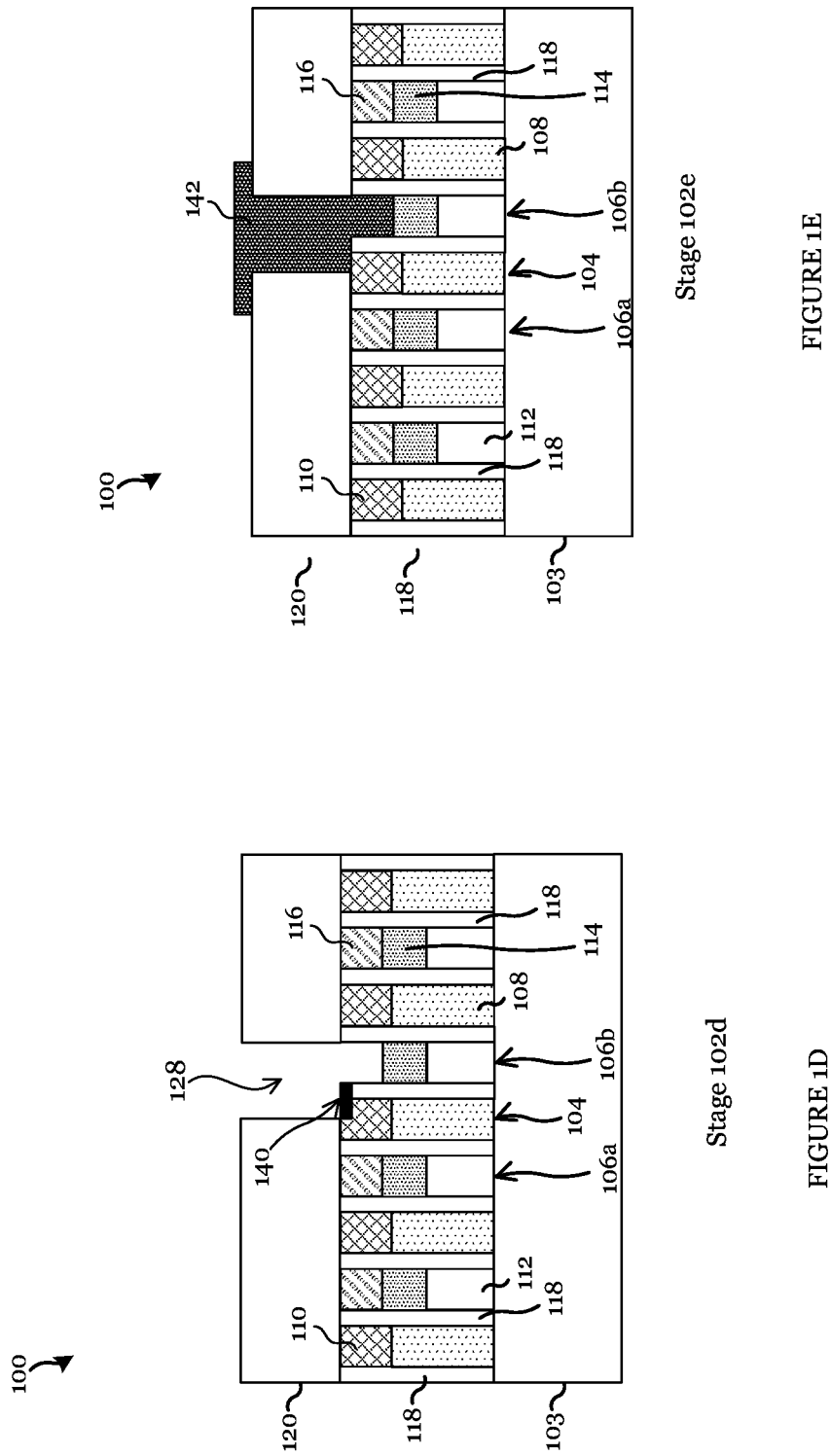

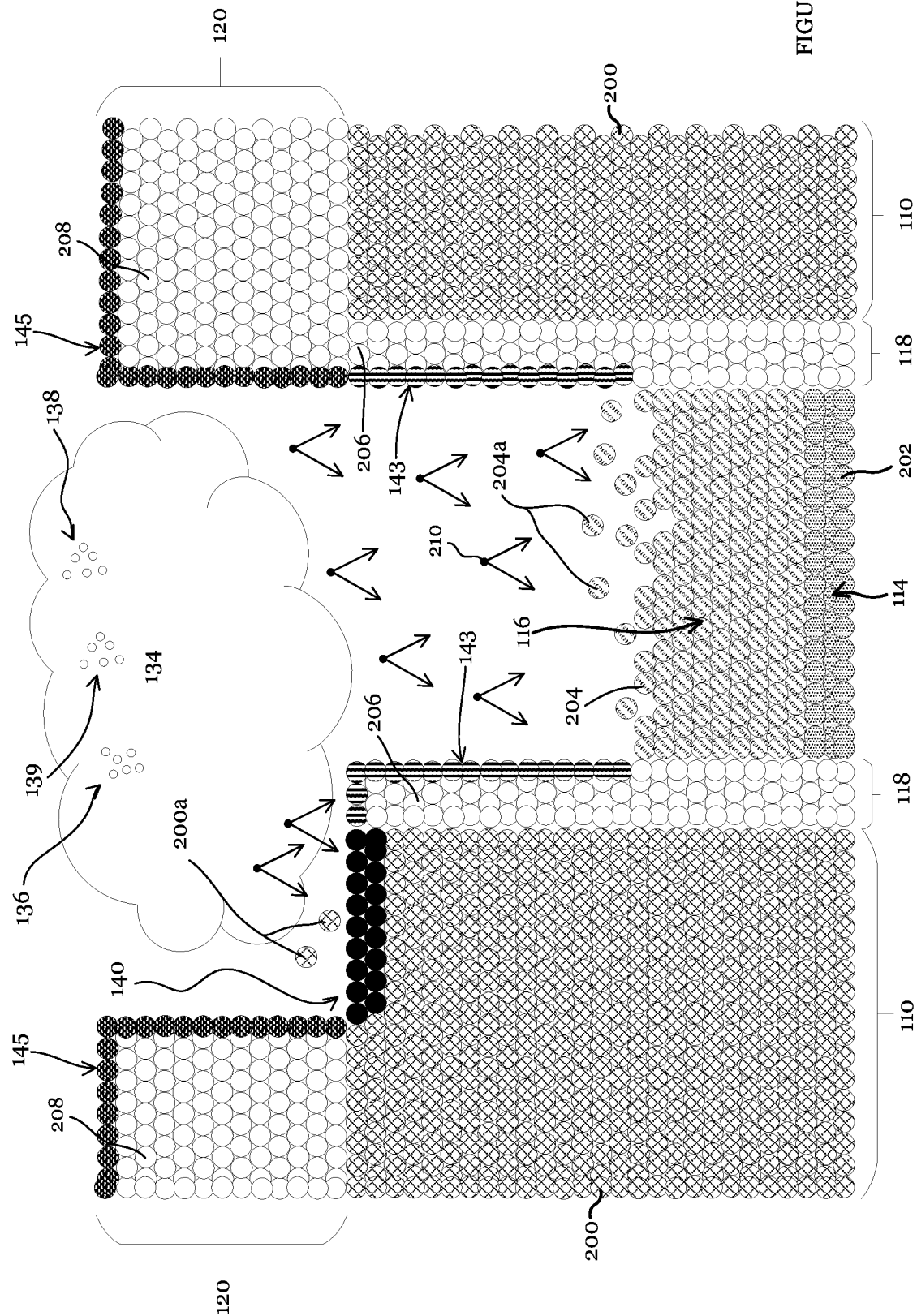

CONTACT OPENINGS IN SEMICONDUCTOR DEVICES

CROSS-REFERENCE TO RELATED APPLICATIONS

This application claims the benefit of U.S. Provisional Application No. 63/025,531, filed on May 15, 2020, which is incorporated by reference.

TECHNICAL FIELD

This disclosure relates generally to semiconductor microfabrication, and, in certain embodiments, to etching contact openings in semiconductor devices.

BACKGROUND

Semiconductor devices typically are fabricated by sequentially depositing insulating or dielectric layers, conductive layers, and other layers of material over a semiconductor substrate, and patterning the various layers using lithography to form circuit components and elements on the semiconductor substrate. The semiconductor industry continues to increase the density of electronic components (e.g., transistors, diodes, resistors, capacitors, etc.) by continual reductions in minimum feature size, allowing more components to be integrated into a particular area. As minimum feature sizes are reduced, additional problems arise.

SUMMARY

In certain embodiments, a method for processing a semiconductor substrate includes receiving a semiconductor substrate. The semiconductor substrate includes a nitride etch stop layer over a gate electrode; a metal-based etch stop layer over a source/drain contact region, the source/drain contact region being adjacent to the gate electrode; and a dielectric layer overlying the metal-based etch stop layer and the nitride etch stop layer. The method further includes patterning, to expose respective surfaces of the metal-based etch stop layer and the nitride etch stop layer, the dielectric layer using a patterned resist layer over the dielectric layer as an etch mask. The method further includes etching the metal-based etch stop layer using a plasma etching process that selectively etches the metal-based etch stop layer until a surface of the source/drain contact region is exposed, at least a portion of the nitride etch stop layer remaining over the gate electrode after the plasma etching process. The plasma etching process includes exposing the semiconductor substrate to a plasma that includes a corrosive material and a fluorine-based reducing agent.

In certain embodiments, a method for processing a semiconductor substrate includes receiving a semiconductor substrate that includes a nitride etch stop layer aligned to a gate electrode and a metal-based etch stop layer aligned to a source/drain contact region. The method further includes selectively etching the metal-based etch stop layer, to remove the metal-based etch stop layer and expose a surface of the source/drain contact region, by exposing the semiconductor substrate to a plasma formed in a gas comprising a corrosive material and fluorocarbon.

In certain embodiments, a method for processing a semiconductor substrate includes positioning a semiconductor substrate in a plasma process chamber of a plasma process tool. The semiconductor substrate includes a nitride etch stop layer covering a surface of a gate electrode and a metal-based etch stop layer covering a surface of a source/drain contact region. The method further includes selectively etching the metal-based etch stop layer, to remove the metal-based etch stop layer and expose the surface of the source/drain contact region, by exposing the semiconductor substrate to a plasma. The plasma is formed in a gas that includes chlorine and fluorocarbon. The plasma forms a passivation layer on a surface of the nitride etch stop layer, inhibiting etching of the nitride etch stop layer during exposure of the semiconductor substrate to the plasma such that the surface of the gate electrode remains covered by at least a portion of the nitride etch stop layer following removal of the metal-based etch stop layer.

BRIEF DESCRIPTION OF THE DRAWINGS

For a more complete understanding of this disclosure, and the advantages thereof, reference is now made to the following descriptions taken in conjunction with the accompanying drawings, in which:

FIGS. 1A-1E illustrate a cross-sectional view of a semiconductor substrate at various stages of processing, according to certain embodiments of this disclosure;

FIG. 2 illustrates examples details of a process for etching a metal-based etch stop layer, according to certain embodiments of this disclosure;

DETAILED DESCRIPTION OF ILLUSTRATIVE EMBODIMENTS

Figure 3:
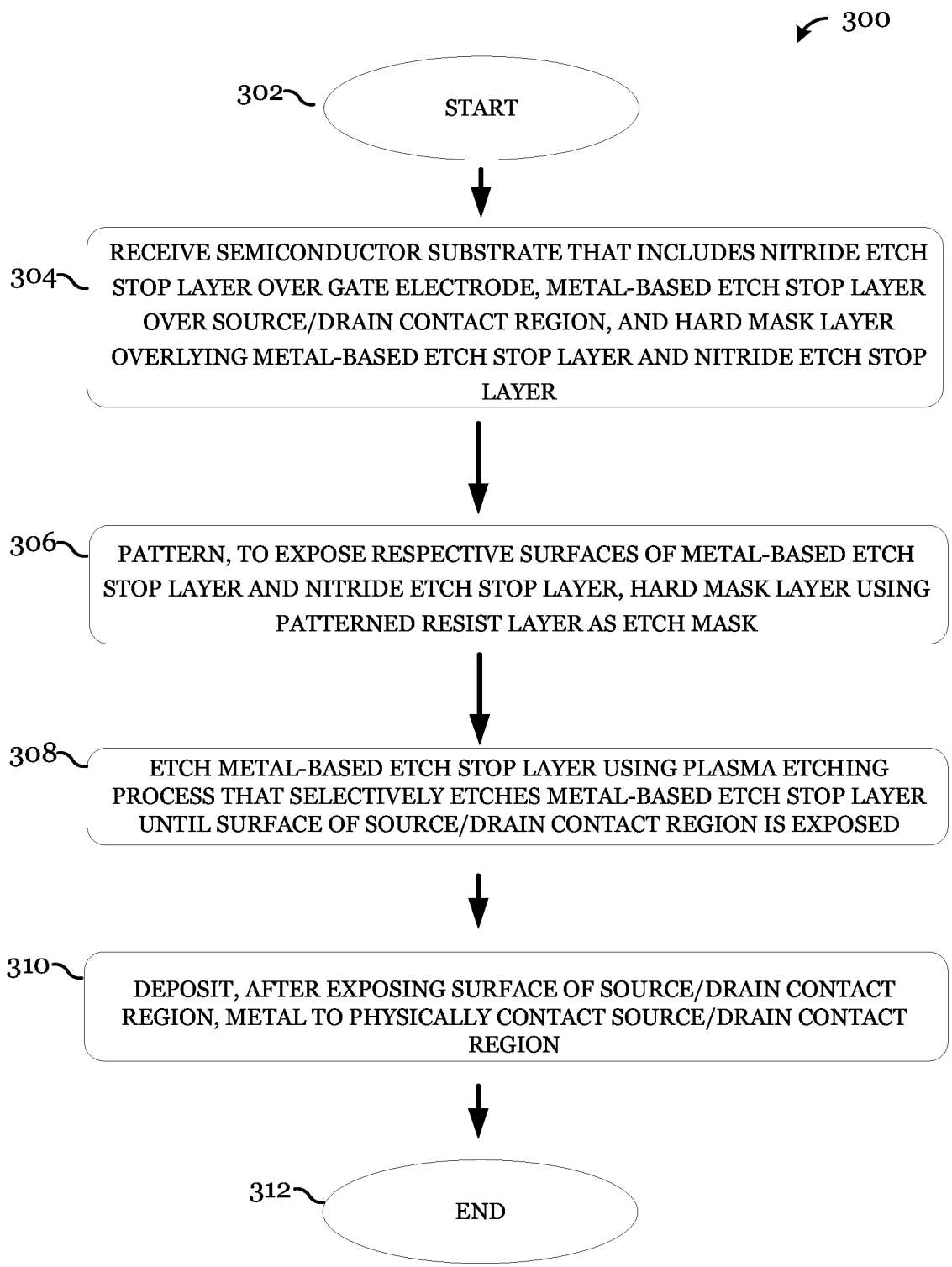
FIG. 3 illustrates an example method for processing a semiconductor substrate, according to certain embodiments of this disclosure.

As described above, as semiconductor devices have continued to shrink, so has a size of features formed on a semiconductor substrate and a density of those features. One area in which this small feature size and increased feature density creates challenges is in forming conductive contacts to certain features of a semiconductor substrate, such as to gate electrodes or source and/or drain regions. A vertical connection to an active region, such as a gate or a source or drain region in the substrate is referred to as a "contact." The contact is an opening formed in a dielectric layer overlying the substrate or fin that is then filled with conductive material. Creating a contact includes forming an opening (e.g., a hole, via, or other recess) in one or more overlying layer (e.g., one or more dielectric layers and/or one or more patterning layers) to create a path for an electrical connection to an underlying feature, such as to a gate electrode or a source/drain region, and depositing a conductive material (e.g., metal) in the opening.

For example, with the increase in feature density and decrease in feature size, ensuring that an opening for a contact formed through one or more overlying layers exposes a surface of the intended target layer such that a contact to the intended target can be made is difficult. As a particular example, if a contact is intended to be formed to a gate electrode, it may be difficult to ensure that the formed contact lands on the gate electrode. As another particular example, if a contact is intended to be formed to a source/drain region, it may be difficult to ensure that the formed contact lands on the source/drain region.

As another example, it may be difficult to ensure that, even if the opening for a contact formed through one or more overlying layers exposes a surface of the intended target layer, the contact does not also expose another surface of another layer to which the contact is not intended to be formed, particularly where such a contact would simultaneously physically contact both the intended and unintended target layer, which may create the potential for a short in a semiconductor device when an electric charge is applied (e.g., to a transistor being formed in the semiconductor device). As a particular example, if a contact is intended to be formed to a gate electrode, it may be difficult to ensure that the formed contact not only lands on the gate electrode, but does not also land on a source/drain contact region that is adjacent to the gate electrode. As another particular example, if a contact is intended to be formed to a source/drain contact region, it may be difficult to ensure that the formed contact not only lands on the source/drain contact region, but does not also land on a gate electrode that is adjacent to the source/drain contact region.

As part of a semiconductor fabrication process, an etch stop layer (sometimes referred to as a capping layer) may be formed over one or more of the gate electrode and/or source/drain contact regions of a semiconductor wafer to reduce the possibility of deposited conductive material for a contact being deposited on unintended features of the wafer and for other purposes. For example, a semiconductor process may include forming a gate etch stop layer, sometimes referred to as a gate capping layer, to reduce the possibility of unintentionally forming a contact to a gate electrode when forming a contact to another area of the device (e.g., to a source/drain contact region). As another example, a semiconductor process may include forming a source/drain etch stop layer, sometimes referred to as a source/drain capping layer, to reduce the possibility of unintentionally forming a contact to a source/drain contact region when forming a contact to another area of the device (e.g., to a gate electrode). As yet another example, some semiconductor fabrication processes include forming both gate etch stop layers and source/drain etch stop layers.

In semiconductor fabrication processes that include forming such etch stop layers, the etch stop layer (e.g., the gate etch stop layer or the source/drain etch stop layer) is wholly or partially removed when a contact to the underlying contact region (e.g., a gate electrode or a source/drain contact region) is desired. Unfortunately, some typical etch stop layers and typical etch processes demonstrate poor selectivity such that both etch stop layers are removed, again creating the potential for a short in a semiconductor device when an electric charge is applied (e.g., to a transistor being formed in the semiconductor device).

For example, some etch stop layers over source/drain contact regions too closely match an overlying layer, such that when the overlying layer is etched to create an opening to subsequently etch a gate etch stop layer (e.g., a nitride etch stop layer, such as a silicon nitride (SiN) etch stop layer) overlying a gate electrode to create an opening to the gate electrode (for a contact), the etch stop layer over the source/drain region also is etched in an overetch region of the opening, creating the possibility of a short. To reduce or eliminate the creation of a short when etching an opening for a gate contact, a metal-based etch stop layer (e.g., a metal-based capping layer, such as a metal-oxide capping layer) may be deposited over source/drain regions, such that an etchant used to etch an opening in an overlying layer for the gate contact selectively etches material over the gate rather than the metal-based etch stop layer over the source/drain contact region.

As another example, even in instances where a material of the etch stop layer over the source/drain contact region is different than the material of the overlying layer, such as when a metal-based etch stop layer is used (e.g., a metal-oxide layer), an etch process for forming an opening to a source/drain contact region (e.g., by etching the metal-based etch stop layer to expose the source/drain contact region) may unintentionally etch the gate etch stop layer such that the gate electrode is exposed, again creating the possibility of a short.

Embodiment of this disclosure provide techniques for etching a metal-based etch stop layer (e.g., a metal-oxide layer) overlying a source/drain contact region to provide a contact to the source/drain contact region that reduces or eliminates etching of an etch stop layer (e.g., a SiN capping layer) overlying a gate electrode, thereby reducing the possibility of a path for a short being created between the source/drain contact region and the gate electrode. In certain embodiments, the techniques for etching the metal-based etch stop layer overlying the source/drain contact region to provide the contact to the source/drain contact region allows for self-alignment of the contact to the source/drain contact region, while still allowing a metal-based etch stop layer to be used as the etch stop layer (e.g., a metal-oxide layer) over the source/drain region, which may provide certain advantageous electrical properties, such as a high breakdown voltage and low dielectric constant.

FIGS. 1A-1E illustrate a cross-sectional view of a semiconductor substrate 100 at various stages 102 of processing, according to certain embodiments of this disclosure. Semiconductor substrate 100 may be a portion of a substrate of a larger device (e.g., wafer or semiconductor wafer) undergoing microfabrication.

As shown in FIG. 1A, which illustrates semiconductor substrate at stage 102a, the elements of semiconductor substrate 100 may be formed on or part of an underlying layer 103, such as an underlying substrate, which can be of any suitable material, such as organic hardmasks, oxides, nitrides, dielectrics, barrier materials, or conducting materials. Alternatives for underlying layer 103 may include a layer of semiconductor material, which may be formed by epitaxial growth, over an insulator (SOI). In a particular example, underlying layer 103 includes silicon or silicon dioxide, but other alternatives such as germanium, silicon germanium, and gallium arsenide may be used.

Semiconductor substrate 100 includes multiple gate regions 104 and multiple source/drain regions 106. In the illustrated example, each gate region 104 has at least one adjacent source/drain region 106. In certain embodiments, a source/drain region 106a adjacent to a gate region 104 to a first side of the gate region 104 is either a source or a drain region, and a source/drain region 106b to an opposite second side of the gate region 104 is the other of a source or a drain region. Additionally or alternatively, a particular source/drain region 106 may serve as both a source and a drain. For example, in a multi-gate structure, a particular source/drain region 106 may serve as a source for one gate region 104 and as a drain for another gate region 104. For simplicity, this disclosure uses the term source/drain region to indicate that source/drain region 106 could be a source region, a drain region, or both.

In the illustrated example, each gate region 104 includes a gate electrode 108 and a gate etch stop layer 110. Gate region 104 may take other suitable forms, if desired.

Gate electrodes 108 may be formed of a doped polysilicon (possibly over a gate dielectric), for example, or a metal gate may be used. In certain embodiments, gate electrode 108 is a high dielectric constant (high-k) metal gate, often abbreviated as HKMG. This disclosure contemplates gate electrode being any suitable type of gate and including any type of material suitable for a gate.

If appropriate, gate electrodes 108 may be formed over gate dielectric layers. A gate dielectric layer includes a dielectric material, such as silicon oxide, silicon oxynitride, silicon nitride, a high-k dielectric material, or combinations thereof. The gate dielectric layer may have a multilayer structure. For example, the gate dielectric layer may include an interfacial layer (e.g., a silicon oxide layer formed by a thermal process or an atomic layer deposition (ALD) process) formed over underlying layer 103, and a high-k dielectric layer formed over the interfacial layer.

In the case of gate electrodes 108 being metal gates, a metal gate structure can have a stacked structure including a high-k constant gate layer, a diffusion barrier layer, a metal work function layer, a metallic layer, and/or other suitable layers. For example, gate electrode 108 may be disposed over the above-discussed gate dielectric layer. Gate electrodes 108 include a conductive material, such as polycrystalline silicon (polysilicon), aluminum (Al), copper (Cu), titanium (Ti), tantalum (Ta), tungsten (W), molybdenum (Mo), platinum (Pt), tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. The conductive material of gate electrodes 108 may be doped or undoped depending on design requirements of field effect transistor (FET) devices for which semiconductor substrate 100 is being formed.

In certain embodiments, gate electrode 108 includes a work function layer tuned to have a proper work function for enhanced performance of the FET devices for which semiconductor substrate 100 is being formed. For example, for FET devices that are NFETs, the work function layer includes an n-type work function metal (n-metal). As another example, for FET devices that are PFETs, the work function layer includes a p-type work function metal (p-metal). A conductive layer, such as an aluminum or tungsten layer, may be formed over the work function layer.

Gate etch stop layer 110 is formed selectively over gate electrode 108. Gate etch stop layer 110 also may be referred to as a gate capping layer. Gate etch stop layer 110 may include silicon, SiN, or another suitable material. Gate etch stop layer 110 may be deposited in any suitable manner. In certain embodiments, gate etch stop layer 110 is formed using an ALD processing technique, which helps to achieve a highly localized deposition profile. In other embodiments, gate etch stop layer 110 is formed using a selective deposition process that may include a chemical vapor deposition (CVD), plasma enhanced CVD (PECVD), or any other suitable process.

Gate etch stop layer 110 may be formed to completely cover and directly contact gate electrode 108. In certain embodiments, gate etch stop layer 110 is formed to a thickness in a range from about 20 nm to about 40 nm; however, this thickness range is provided for example purposes only. Gate etch stop layer 110 may be intended to protect gate electrode 108 during various etching steps, to electrically isolate (or at least provide sufficient electrical isolation of) gate electrode 108, and to serve other suitable purposes. As just one example, gate etch stop layer 110 may be intended to protect gate electrode 108 from being exposed during an etch process for creating an opening for a contact to a source/drain region 106, as described below.

Source/drain regions 106 may include epitaxial layer 112, source/drain contact region 114, and metal-based etch stop layer 116. Source/drain regions 106 may take any suitable form. In certain embodiments, source/drain regions 106 may be formed as fins for fin FET (finFET) devices. The fins may be formed of bulk semiconductor material. Epitaxially grown material may be used as the fin, or a fin may be created in the bulk semiconductor material. Alternatively, these active regions may be formed as source/drain diffusions in a planar MOS process.

Epitaxial layer 112 of source/drain regions 106 may be epitaxially grown. For example, epitaxial layer 112 may be epitaxially grown on a surface of underlying layer 103, possibly in trenches or other recesses of underlying layer 103. In certain embodiments, the epitaxial growth process may use precursors such as silane ($SiH_4$) or dichlorosilane ($SiCl_2H_2$) to grow semiconductor material of source/drain region 106. The material of epitaxial layer 112 may be doped (e.g., with p-type dopants, n-type dopants, or a combination) or un-doped.

The material of epitaxial layer 112 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Epitaxial layer 112 may be formed of the same material as underlying layer 103 or may include different materials than underlying layer 103.

As semiconductor devices, such as metal-oxide-semiconductor FETs (MOSFETs), are scaled down through various technology nodes, strained source/drain features have been implemented using epitaxial semiconductor materials to enhance carrier mobility and improve device performance. Forming a MOSFET with stressor regions often epitaxially grows silicon to form raised source and drain features for an n-type device, and epitaxially grows SiGe to form raised source and drain features for a p-type device.

In certain embodiments, epitaxial layers 112 may be formed in a single epitaxial growth process. In other embodiments, epitaxial layers 112 may be grown in multiple stages. For example, a multi-stage growth process can begin with growing an initial epitaxial layer with a first doping to a pre-determined thickness followed by the growth of a second layer with a second doping. For example, the second doping may be higher than the first doping. Similarly, the different layer may have different compositions of, for example, germanium or other compounds. The epitaxial growth process may use any type of epitaxial process including molecular beam epitaxy (MBE), or various types of CVD.

Source/drain contact region 114 includes a conductive material suitable for serving as a conductive conduit to source/drain region 106. As described above, the source/drain region 106 of which source/drain contact region 114 is a part may be a source region, a drain region, or both. Similarly source/drain contact region 114 may be a source contact region, a drain contact region, or both.

The material of source/drain contact region 114 may include a conductive material such as metal. For example, the conductive material of source/drain contact region 114 may include tungsten, aluminum, cobalt, or ruthenium. In certain embodiments, one or more liners/barrier layers (e.g., titanium nitride (TiN), tantalum nitride, or the like) ultimately may be deposited as part of a fabrication process prior to deposition of a contact material for a contact to source drain contact region 114. This disclosure contemplates source/drain contact region 114 including any suitable material.

Metal-based etch stop layer 116 is formed selectively over source/drain contact region 114. Metal-based etch stop layer 116 also may be referred to as a source/drain capping layer. Metal-based etch stop layer 116 may serve as a protection layer for the underlying source/drain contact region 114, such as during a process in which a gate contact to gate electrode 108 is formed, in part by removing gate etch stop layer 110.

Metal-based etch stop layer 116 may include metal oxides (MOx), metal nitrides (MNx), or metal oxynitrides such as, AlOx, AlN, TiOx, TiN, TaN etc., where the "M" represents an elemental metal such as aluminum, titanium, tantalum, and others. Example metal oxides include zinc oxide (ZnO), titanium oxide ($TiO_2$), tungsten oxide ($WO_3$), tin oxide ($SnO_2$), cuprous oxide ($Cu_2O$), cadmium oxide (CdO), vanadium oxide ($V_2O_5$), cupric oxide (CuO), nickel oxide (NiO), and molybdenum oxide ($MoO_2$).

Metal-based etch stop layer 116 may be deposited in any suitable manner. In certain embodiments, metal-based etch stop layer 116 is formed using an ALD processing technique, which helps to achieve a highly localized deposition profile. In other embodiments, metal-based etch stop layer 116 is formed using a selective deposition process that may include a CVD, PECVD, metal-organic CVD (MOCVD), or other suitable process. Metal-based etch stop layer 116 may be formed to completely cover and directly contact source/drain contact region 114. In certain embodiments, metal-based etch stop layer 116 is formed to a thickness of less than 30 nm (including less than 10 nm), and in particular to a thickness in a range from about 10 nm to about 30 nm. These thickness ranges are provided for example purposes only. The particular thickness of metal-based etch stop layer 116 that is achievable depends on the particular material(s) used and electrical properties associated with them (i.e. dielectric constant and breakdown voltage) for metal-based etch stop layer 116.

In certain embodiments, use of metal oxides as metal-based etch stop layer 116 may provide desirable electrical properties, such as a high breakdown voltage and a low dielectric constant in a semiconductor device formed from semiconductor substrate 100.

Each gate region 104 is separated from adjacent source/drain regions 106 by a spacer 118. Spacers 118 may include any suitable material and be formed in using any suitable process. Spacers 118 may include silicon, oxygen, boron, carbon, nitrogen, or other suitable materials, alone or in combination. As particular examples, spacers 118 may include SiN, oxynitride, SiOCN, SiBCN, SiON, oxide, and the like. The material of spacers 118 may be chosen to be selectively not etched during later processes (e.g., subsequent etch steps for creating an opening or openings for gate or source/drain contacts. The illustrated spacers 118 are provided as examples, and this disclosure contemplates any suitable spacers for a given structure.

Semiconductor substrate 100 includes multiple layers overlying the structures described above, and these layers may be used as pattern and/or mask layers for etching openings for contacts to gate electrodes or source/drain contact regions. Certain of these multiple layers may be sacrificial and removed in a subsequent processing step. Additionally or alternatively, one or more of these multiple layers may remain to serve as an interlayer dielectric layer through which a contact may be formed. Although particular layers and a particular number of layers are shown and described, this disclosure contemplates semiconductor substrate 100 having any suitable types and number of layers overlying the structures described above.

In the illustrated example, semiconductor substrate 100 includes overlying layer 120, overlying layer 122, and overlying layer 124, as well as patterned resist layer 126.

Overlying layer 120 may be a dielectric layer and may be referred to as an overburden layer. In certain embodiments, some or all of overlying layer 120 may remain after subsequent process to serve as an interlayer dielectric through which a contact is formed. Overlying layer 120 may be formed of various insulators used in semiconductor processing including silicon oxide, SiN, silicon oxynitride, and others. High-k and low-k dielectrics may be used. Multiple layer dielectrics may be used.

Overlying layer 122 may be a planarization layer, such as an organic planarization layer (OPL). For example, overlying layer 122 may be an amorphous carbon layer.

Overlying layer 124 may be an anti-reflective coating, such as a silicon anti-reflective coating.

Patterned resist layer 126 may be a photoresist layer and patterned to facilitate formation of one or more openings 128 through overlying layers 120, 122, and 124, and ultimately for formation of a contact. For example, patterned resist layer 126 may serve as an etch mask when forming one or more openings 128.

Patterned resist layer 126 may be formed using any suitable process. In certain embodiments, patterned resist layer 126 is a photoresist. Patterned resist layer 126 may be patterned using a lithography process. In certain embodiments, patterned resist layer 126 is patterned using an extreme ultraviolet (EUV) lithography process or electron beam (e-beam) lithography process. As just one particular example, patterned resist layer 126 is approximately 50 nm to 60 nm thick; however, this disclosure contemplates patterned resist layer 126 having any suitable thickness.

Patterned resist layer 126 defines a pattern for forming openings 128 (in the illustrated example, a single opening 128) for creating a contact to a gate region 104 or a source/drain region 106 (in the illustrated example, to a source/drain region 106*b*). In certain embodiments, a width of an opening 128 defined by patterned resist layer 126 is wide enough to increase the likelihood that, once etched in a subsequent etch process, opening 128 exposes at least a portion of a surface of the intended target (e.g., in the illustrated example, a surface of metal-based etch stop layer 116). This width, however, also may increase the likelihood that at least a portion of a surface of an unintended target of opening 128 will be exposed when opening 128 is etched in a subsequent etch process (e.g., a surface of gate etch stop layer 110). In certain embodiments, the opening 128 defined by patterned resist layer 126 is sufficiently wide to ensure that the resulting opening 128 in overlying layer 120 exposes at least a portion of the intended target for the contact, in this case, source/drain region 106*b*, even if the pattern defined by patterned resist layer 126 is misaligned to some degree.

Dashed lines 130 show an etch path for forming a contact to source/drain region 106 (e.g., source/drain region 106*b* in the illustrated example), namely an etch path for opening 128. This etch path is defined by patterned resist layer 126.

As shown in FIG. 1A, the etch path defined by dashed lines 130 leads to portions of surfaces of gate etch stop layer 110, source/drain etch stop layer 116, and spacer 118. Thus, when creating an opening to source/drain region 106b, by removing metal-based etch stop layer 116, it is desirable to leave sufficient material of gate etch stop layer 110 to avoid creating a short between gate region 104 and source/drain region 106b.

Semiconductor substrate 100 may be formed in any suitable manner. As just one example, portions of semiconductor substrate 100 may be formed by depositing the material of metal-based etch stop layer 116 (e.g., $TiO_2$). The material of metal-based etch stop layer 116 may be deposited by ALD, spin-on deposition, or using any other suitable deposition process. A planarizing step then may be performed. For example, a planarizing etch step may be performed to attempt to remove the material of metal-based etch stop layer 116 from areas other than over source/drain contact region 114, while also creating a planar surface on the top of the then-existing semiconductor substrate undergoing fabrication. Overlying layers (e.g., overlying layers 120, 122, 124, as well as patterned resist layer 126) may then be deposited using any suitable combination of processes. For example, overlying layer 120 may be deposited following planarization (and possibly cleaning) of the semiconductor substrate after deposition of metal-based etch stop layer 116.

Although semiconductor substrate 100 is described as having a particular composition, this disclosure contemplates semiconductor substrate 100 taking other suitable forms, if appropriate.

FIG. 1B illustrates a subsequent stage 102b of processing semiconductor substrate 100, according to certain embodiments of this disclosure. At stage 102b, semiconductor substrate 100 has been etched to form opening 128 in overlying layer 120, thereby exposing portions (or all) of surfaces of gate etch stop layer 110, source/drain etch stop layer 116 (at source/drain region 106b), and spacer 118. In this example, overlying layer 122, overlying layer 124, and patterned resist layer 126 have been removed. Furthermore, in this example, a portion or all of overlying layer 120 remains, opening 128 being formed therein.

The etch process to form opening 128 in overlying layer 120 and remove overlying layer 122, overlying layer 124, and patterned resist layer 126 may include one or multiple etch steps. For example, the process to form opening 128 in overlying layer 120 and remove overlying layer 122, overlying layer 124, and patterned resist layer 126 may include any suitable combination of wet etch steps and/or dry etch steps (e.g., plasma etch steps).

In this example, opening 128 is being defined to create a contact to source/drain region 106b, and specifically to source/drain contact region 114 of source/drain region 106b. Due to the width of opening 128, however, portions (or all) of surfaces of gate etch stop layer 110, source/drain etch stop layer 116, and spacer 118 are exposed at the base of opening 128. Thus, to expose source/drain contact region 114, metal-based etch stop layer 116 will be removed, by an etching process for example. Because portions (or all) of surfaces of gate etch stop layer 110 and source/drain etch stop layer 116 are exposed at the base of opening 128, however, it is desirable for the etch process for etching source/drain etch stop layer 116 to be selective to etching source/drain etch stop layer 116 to avoid also removing gate etch stop layer 110 and thereby expose both gate electrode 108 (unintentionally) and source/drain contact region 114 (intentionally). Exposing both gate electrode 108 (unintentionally) and source/drain contact region 114 (intentionally) may provide a path for an electrical short when a contact material is deposited in opening 128.

FIG. 1C illustrates a subsequent stage 102c of processing semiconductor substrate 100, according to certain embodiments of this disclosure. At stage 102c, an etch process 132 is being performed to remove metal-based etch stop layer 116, to expose source/drain contact region 114, while leaving at least a portion of gate etch stop layer 110. In the illustrated state of stage 102c, metal-based etch stop layer 116 is shown as being partially removed.

In certain embodiments, etch process 132 is a plasma etch process that uses plasma 134 to remove metal-based etch stop layer 116, to expose source/drain contact region 114, while leaving at least a portion of gate etch stop layer 110. Plasma 134 includes a corrosive material 136 and a reducing agent 138, described below.

Corrosive material 136 of plasma 134 may include chlorine (or a compound that includes chlorine such as Boron trichloride ($BCl_3$)), bromine (or a compound that includes bromine, such as hydrogen bromide (HBr)), or any other suitable corrosive material. As another example, carbon tetrafluoride ($CF_4$) may be used to etch certain metals, such as titanium, but possibly with an increased etch rate of the material of gate etch stop layer 110 relative to other options for inclusion in plasma 134.

Rather than simply using a reducing agent, such as carbon, reducing agent 138 of plasma 134 includes a fluorine-based compound to perform the etch to remove metal-based etch stop layer 116 and expose source/drain contact region 114. In certain embodiments, the fluorine-based compound includes fluorocarbon ($C_xF_y$), dichlorodifluoromethane ($CCl_2F_2$), sulfur trifluoride ($SF_3$), sulfur hexafluoride ($SF_6$), or another suitable fluorine-based compound. A particular example fluorocarbon is hexafluoro-1,3-butadiene ($C_4F_6$) or octafluorocyclobutane ($C_4F_8$), but could include any suitable fluorocarbon ($C_xF_y$). In certain embodiments, the amount of the fluorine-based compound (e.g., fluorocarbon) introduced to etch process 132 is relatively low, such as 1.0 to 5.0 sccm. This particular amount is provided as an example only. The particular amount of the fluorine-based compound (e.g., fluorocarbon) introduced to etch process 132 will depend on the particular fluorine-based compound used. In certain embodiments, a deposition-rich fluorocarbon compound, such as $C_4F_6$ or $C_4F_8$, is used at low flows (e.g., in the range of approximately 1 sccm to about 5 sccm or less) to reduce or prevent passivation-induced etch stop, which may be exacerbated by high aspect ratio etching and/or small contact sizes. Other fluorocarbon compounds with F/C ratios >2, such as $CF_4$, or fluoro-hydrocarbons, such as $CHF_3$, $CH_2F_2$, $CH_3F$, and others, can be used at higher flow rates with lower risk of passivation-induced etch stop.

To facilitate etching metal-based etch stop layer 116 to expose source/drain contact region 114 while reducing or eliminating etching of gate etch stop layer 110, adding the fluorine-based compound to plasma 134 may provide one or more of the following: increased selectivity to gate etch stop layer 110, such that a plasma 134 that comprises corrosive material 136 and reducing agent 138 etches metal-based etch stop layer 116 at a faster rate than plasma 134 etches gate etch stop layer 110; the formation of passivation layers (e.g., passivation layers 140 and 143) on surfaces of gate etch stop layer 110 and spacers 118, which may reduce or eliminate etching of gate etch stop layer 110 and spacers 118 during etch process 132; and an accelerated etch rate of metal-based etch stop layer 116 relative to an etch process for etching metal-based etch stop layer 116 that does not incorporate a fluorine-based compound.

In addition, in certain embodiments, plasma 134 also is selective to spacers 118, such that etching of spacers 118 during etch process 132 less than the etch rate of metal-based etch stop layer 116, and is potentially non-existent or minimal. In certain embodiments, including the fluorine-based compound in plasma 134 fluorinates some or all of a surface of metal-based etch stop layer 116, which may catalyze a reaction of metal-based etch stop layer 116 to corrosive material 136 (e.g., chlorine) of plasma 134 to potentially increase an etch rate of metal-based etch stop layer 116 relative to plasmas that do not include a fluorine based compound.

In certain embodiments, use of plasma 134, which includes fluorine-containing compound, causes a passivation layer 140 to be formed on at least a portion of the surface of gate etch stop layer 110 exposed to plasma 134 in opening 128 during etch process 132. Additionally or alternatively, use of plasma 134 may cause a passivation layer 143 to be formed on at least a portion of the surfaces of spacers 118 exposed to plasma 134 in opening 128 during etch process 132 Passivation layers 140 and 143 may be in-situ protection layers that are formed on at least a portion of the surface of gate etch stop layer 110 and at least a portion of the surfaces of spacers 118 exposed to plasma 134 in opening 128 during etch process 132. Passivation layers 140 and 143 may reduce or eliminate etching of gate etch stop layer 110 and spacers 118, respectively, during etch process 132. As a particular example, the addition of the fluorine-containing compound to plasma 134 may passivate on a SiN (or other) gate etch stop layer 110, forming passivation layer 140 on gate etch stop layer 110. As another particular example, the addition of the fluorine-containing compound to plasma 134 may passivate on the material of spacers 118, forming passivation layer 143 on spacers 118.

In certain embodiments, one or more additional gases 139 may be introduced as part of etch process 132. For example, additional gases 139 may include argon and/or methane (CH$_4$), and may be introduced as part of forming plasma 134 of etch process 132. In certain embodiments, methane may help to passivate surfaces of overlying layer 120 (e.g., a dielectric layer, such as silicon dioxide) that are exposed during etch process 132, which may reduce or eliminate etching of overlying layer 120 during etch process 132. In certain embodiments, inclusion of methane in plasma 134 causes a passivation layer 145 to be formed on at least a portion of the surfaces of overlying layer 120 exposed to plasma 134 during etch process 132. Passivation layer 145 may be an in-situ protection layer that is formed on at least a portion of the surface of overlying layer 120 exposed to plasma 134 during etch process 132. Passivation layer 145 may reduce or eliminate etching of overlying layer 120 during etch process 132. As a particular example, the addition of methane to plasma 134 may passivate on an oxide or other dielectric layer (used as overlying layer 120), forming passivation layer 145 on overlying layer 120.

These examples of additional gases 139 that may be introduced as part of etch process 132 to form plasma 134 are provided as examples only. This disclosure contemplates any suitable additional gases 139 being introduced to form plasma 134.

Magnified view 141 shows the formation of passivation layers 140, 143, and 145, and, at this point of stage 102c, partial etch of metal-based etch stop layer 116 in greater detail.

Although passivation layers 140, 143, and 145 are shown as having different thicknesses relative to one another, passivation layers 140, 143, and 145 may all have generally the same thickness, may all have different thickness, or some may be the same while others are different. Additional details of etch process 132 and passivation layers 140, 143, and 145 are described below with reference to FIG. 2.

As described above, etch process 132 may be a plasma etch process. The plasma etch process may be performed in any suitable type of plasma process tool. For example, the plasma process tool may be a capacitively-coupled plasma (CCP) tool, an inductively-coupled plasma (ICP) tool, or any other suitable type of plasma process tool. The particular process conditions for etch process 132 may vary depending on the type of plasma process tool used to implement etch process 132. Etch rates of various layers, including gate etch stop layer 110 (if etched at all as part of etch process 132) and metal-based etch stop layer 116 may be related to an applied bias power of the plasma process tool. Generally, during etch process 132, it may be desirable to maintain a relatively low bias power to provide a high enough etch rate of metal-based etch stop layer 116, but not so high that gate etch stop layer 110 is etched at an unacceptable rate.

Etch process 132 may be a single-step etch process or a multi-step etch process. In a single-step etch process, etch process 132 may include a single step of introducing appropriate gases, including corrosive material 136 and reducing agent 138, to form plasma 134 and remove metal-based etch stop layer 116 to expose at least a portion of a surface of source/drain contact region 114. In a multi-step etch process, etch process 132 may include cyclically executing, until the surface of the source/drain contact region 114 is exposed, forming passivation layer 140 on the surface of gate etch stop layer 110 (e.g., a nitride etch stop layer) (as well as, possibly, passivation layers on other surfaces of substrate 100) and etching a portion of metal-based etch stop layer 116. Passivation layer 140 may inhibit etching of gate etch stop layer 110 (e.g., the nitride etch stop layer). In this example, appropriate gases may be alternately pulsed into and purged from a chamber of a plasma process tool in which semiconductor substrate 100 is being processed. A multi-step process for etch process 132 may be considered a quasi-atomic layer etching process.

FIG. 1D illustrates a subsequent stage 102d of processing semiconductor substrate 100, according to certain embodiments of this disclosure. At stage 102d, etch process 132 of stage 102c has completed such that sufficient amounts of metal-based etch stop layer 116 have been removed to expose source/drain contact region 114 of source/drain region 106b, while at least a portion of gate etch stop layer 110 remains to cover gate electrode 108.

In certain embodiments, etch process 132 self-terminates when some or all of a top surface of source/drain contact region 114 is exposed. For example, plasma 134 may selectively etch metal-based etch stop layer 116 relative to source/drain contact region 114 such that etch process 132 terminates when some or all of the top surface of source/drain contact region 114 is exposed. This disclosure contemplates etch process 132 terminating in any suitable manner.

FIG. 1E illustrates a subsequent stage 102e of processing semiconductor substrate 100 in which a contact material 142 may be deposited in opening 128 to form an electrical contact to source/drain contact region 114 of source/drain region 106b. Examples of contact material 142 include metal or metal nitrides, such as copper, tungsten, aluminum, titanium, combinations, or other suitable metals, to form contacts contacting the source/drain contact region 114. Contact material 142 may be deposited by PVD, electrochemical deposition, CVD, combinations thereof, or other suitable deposition processes.

As shown in FIG. 1E, at least a portion of gate etch stop layer 110 sufficient to cover gate electrode 108 remains, reducing or eliminating the opportunity for a short to occur between gate region 104 and source/drain region 106b (and particularly source/drain contact region 114 of source/drain region 106b).

FIG. 2 illustrates example details of a process for etching a metal-based etch stop layer, according to certain embodiments of this disclosure. The state of the portion of semiconductor substrate 100 shown in FIG. 2 generally corresponds to the state of a corresponding portion of semiconductor substrate 100 shown in FIG. 1C (at stage 102c).

As shown in FIG. 2, gate etch stop layer 110 includes particles 200, source/drain contact region 114 includes particles 202, metal-based etch stop layer 116 includes particles 204, spacers 118 include particles 206, and overlying layer 120 includes particles 208. Particles 200-208 can be atoms, molecules, ions, or any other suitable subdivision of the respective layers of which the particles are a part.

Under appropriate plasma generation conditions for etch process 132, corrosive material 136 and reducing agent 138 interact to form plasma 134, including the generation of ions 210 that attack certain exposed surfaces to etch/remove some or all of the material of those exposed surfaces. In one example, gate etch stop layer 110 includes SiN, metal-based etch stop layer 116 includes TiOx, and etch process 132 is a reactive ion etching (RIE) plasma etching process performed in an CCP plasma process tool. In this example, the gases introduced include chlorine ($Cl_2$) at a flow rate in a range of about 30 sccm to about 140 sccm, fluorocarbon ($C_4F_6$) at a flow rate in a range of about 2 sccm to about 5 sccm, and methane ($CH_4$) at a flow rate in a range of about 0.1 sccm to about 27 sccm. The temperature in the plasma process chamber of the plasma process tool during etch process 132 may be between about 20° C. and about 80° C. These process parameters are provided as examples only.

As just one particular example set of process conditions, gate etch stop layer 110 includes SiN, metal-based etch stop layer 116 includes TiOx, and etch process 132 is an RIE plasma etching process performed in an CCP plasma process tool. In this particular example, the process parameters may include: gases and associated parameters of about 0.5% to about 2% $C_4F_6$, about 3% to about 15% $CH_4$, about 10% to about 20% $Cl_2$, and about 65% to about 80% Ar; a pressure of about 10 mTorr to about 20 mTorr; a high frequency power of about 200 W; a low frequency power of about 50 W to about 200 W; a temperatures of about 20° C. to about 80° C., and an etch rate of about 0.2 nm to about 0.5 nm per second, though the etch rate may depend on the size of the open area being etched and the aspect ratio of recess being created by etching metal-based etch stop layer 116. In certain embodiments, other power parameters may be effective. Additionally, in certain embodiments, temperatures as high as 150° C. and even higher may further improve the selectivity of plasma 134 to etch metal-based etch stop layer 116.

As an even more particular example (and again assuming for this example process that gate etch stop layer 110 includes SiN, metal-based etch stop layer 116 includes TiOx, and etch process 132 is an RIE plasma etching process performed in an CCP plasma process tool), a set of process conditions may include: gases and associated flow rates of $C_4F_6$ at about 2.5 sccm, $Cl_2$ at about 34 sccm, $CH_4$ at about 26 sccm, and Ar at about 200 sccm; a pressure of about 10 mTorr; power parameters of 200 W HF and 50 W LF; and a temperatures of about 50° C. These parameters may provide an etch rate of approximately 0.46 nm per second on the patterned feature.

Again, these particular process parameters are provided as examples only, and this disclosure contemplates other suitable process parameters for achieving various concepts described herein. One of ordinary skill in the art will understand that plasma process tools vary, and the optimal ranges for each parameter for process etching and selectivity may vary from plasma process tool to plasma process tool. For any given tool, the full optimal range could be larger or smaller, or multiple optimal ranges could exist. For example, the optimal selectivity target may vary depending on RF frequency or a single parameter change. As a particular example, the optimal gas flows for selectivity may change for each RF power setting, such as the HF power setting.

As a result of exposure to plasma 134, which includes a fluorine-based compound such as fluorocarbon, passivation layer 140 may be formed on a surface of gate etch stop layer 110 and passivation layers 143 may be formed on surfaces of spacers 118. For example, some of particles 200 of gate etch stop layer 110 may be converted to passivation layer 140, some of particles 206 of spacers 118 may be converted to passivation layer 143, passivation layer 140 may be a new layer deposited on the surface of gate etch stop layer 110, passivation layer 143 may be a new layer deposited on surfaces of spacers 118, or a combination of these may occur. As a particular example, passivation layers 140 and 143 may be an in situ protection layer that is formed during etch process 132 due at least in part to the inclusion of the fluorine based compound in the gases used to form plasma 134 and associated ions 210.

Passivation layer 140 may protect particles 200 of gate etch stop layer 110 that underlie passivation layer 140 from etching during etch process 132, and passivation layer 143 may protect particles 206 of spacers 118 that underlie passivation layer 143 from etching during etch process 132. That is, passivation layer 140 may reduce or eliminate etching of particles 200 of gate etch stop layer 110 that underlie passivation layer 140 from etching during etch process 132, and passivation layer 143 may reduce or eliminate etching of particles 206 of spacers 118 that underlie passivation layer 143 from etching during etch process 132.

An optimal thickness of passivation layers 140 and 143 may depend on various factors, including, for example, a thickness of the layer to be etched (e.g., metal-based etch stop layer 116), a time to complete the etch of metal-based etch stop layer 116, feature size and aspect ratio (e.g., of the recess being created by etching metal-based etch stop layer 116), the open area of the layer to be etched (e.g., metal-based etch stop layer 116), and other materials that may influence etch/passivation loading across the substrate 100. For example, a relatively thin passivation layer 140 and/or 143 (e.g., less than about 15 nm and possibly less than about 10 nm) may be used for smaller features and/or higher aspect ratios (e.g., 5 to 10 or higher), which may reduce or eliminate passivation pinch-off causing etch stop during a continuous plasma etch process, and a relatively thicker passivation layer 140 and/or 143 may be used for larger features and/or a smaller aspect ratio. A multi-step/dynamic process (introducing a flash step to remove buildup of passivation layer 140 and/or 143) or a quasi-atomic layer etch process may allow passivation layer 140 and/or 143 to be thinner while maintaining good selectivity to etch metal-based etch stop layer 116, which may be suitable for etching of higher aspect ratio recesses and/or smaller features, but likely adds processing time to the overall etch process (e.g., etch process 132).

In certain embodiments, even though plasma 134 causes passivation layer 140 to be created on gate etch stop layer 110, depending on the thickness and surface coverage of passivation layer 140, some portions of gate etch stop layer 110 still may be removed during etch process 132. For example, as shown in FIG. 2, in this particular example, at least some particles 200a of gate etch stop layer 110 are still etched despite the presence of passivation layer 140. In other embodiments, passivation layer 140 completely prevents etching of particles 200 of gate etch stop layer that underlie passivation layer 140. The same may be true for particles 206 of spacers 118 despite the presence of passivation layer 143.

This disclosure contemplates plasma 134 forming other passivation layers on other suitable surfaces of other layers. For example, methane (CH$_4$) may be introduced as part of etch process 132 to form plasma 134. In certain embodiments, methane may help to passivate on exposed surfaces of overlying layer 120 (e.g., a dielectric layer, such as silicon dioxide) to reduce or eliminate etching of overlying layer 120 during etch process 132. In the illustrated example, inclusion of methane as part of additional gases 139 causes passivation layer 145 to be formed on at least a portion of the surfaces of overlying layer 120 exposed to plasma 134 during etch process 132, as described above.

Plasma 134 may etch particles 204 of metal-based etch stop layer 116 to remove metal-based etch stop layer 116 over source/drain contact region 114. For example, ions 210 of plasma 134 may attack exposed surfaces of metal-based etch stop layer 116 to remove particles 204 (e.g., as shown with particles 204a) of metal-based etch stop layer 116. In certain embodiments, the use of a fluorine-based reducing agent 138 (e.g., fluorocarbon) in combination with certain corrosive agents (e.g., chlorine) increases an etch rate of metal-based etch stop layer 116 (e.g., a metal-oxide etch stop layer) relative to a plasma that does not include a fluorine-based reducing agent.

In certain embodiments, one or more of the reduction or elimination of etching of particles 200 of gate etch stop layer 110 (if formed) and the increase in etch rate of particles 204 of metal-based etch stop layer 116, may facilitate the removal of metal-based etch stop layer 116 to occur before an undesirable amount of gate etch stop layer 110 is removed, thereby reducing or eliminating the possibility that a layer underlying gate etch stop layer 110 (e.g., gate electrode 108) is exposed as a result of etch process 132. This feature may result in etch process 132 being self-aligned to expose a surface of source/drain contact region 114 while not exposing a surface of gate electrode 108 in that the etch process.

FIG. 3 illustrates an example method 300 for processing semiconductor substrate 100, according to certain embodiments of this disclosure. Embodiments of method 300 could be applied to any of the embodiments described in this disclosure, as well as other suitable embodiments. The method begins as step 302.

At step 304, semiconductor substrate 100 is received. Semiconductor substrate 100 includes gate etch stop layer 110, which may be a nitride etch stop layer, over a gate electrode 108. Semiconductor substrate 100 includes a metal-based etch stop layer 116 over a source/drain contact region 114. Semiconductor substrate 100 further includes a dielectric layer (overlying layer 120) overlying metal-based etch stop layer 116 and gate etch stop layer 110 (e.g., a nitride etch stop layer). Source/drain contact region 114 is adjacent to gate electrode 108. In certain embodiments, metal-based etch stop layer 116 includes titanium oxide, aluminum oxide, or titanium nitride. In certain embodiments, gate etch stop layer 110 (e.g., the nitride etch stop layer) includes silicon nitride. In certain embodiments, semiconductor substrate 100 further includes spacer 118 separating gate electrode 108 and gate etch stop layer 110 (e.g., the nitride etch stop layer) from source/drain contact region 114 and metal-based etch stop layer 116.

At step 306, overlying layer 120 (e.g., a dielectric layer) is patterned using a patterned resist layer (e.g., patterned resist layer 126 over overlying layer 120 as an etch mask to expose respective surfaces of metal-based etch stop layer 116 and gate etch stop layer 110 (e.g., the nitride etch stop layer). In certain embodiments, the surface of gate etch stop layer 110 (e.g., the nitride etch stop layer) is a portion of a top surface of gate etch stop layer 110 (e.g., the nitride etch stop layer), and the surface of metal-based etch stop layer 116 is an entirety of a top surface of metal-based etch stop layer 116. In embodiments in which semiconductor substrate 100 includes spacer 118 separating gate electrode 108 and gate etch stop layer 110 (e.g., a nitride etch stop layer) from source/drain contact region 114 and metal-based etch stop layer 116, patterning overlying layer 120 (e.g., a dielectric layer) using patterned resist layer 126 over overlying layer 120 (e.g., the dielectric layer) as an etch mask may expose a surface of spacer 118.

At step 308, metal-based etch stop layer 116 is etched using a plasma etching process (e.g., etch process 132) that selectively etches metal-based etch stop layer 116 until a surface of source/drain contact region 114 is exposed. At least a portion of gate etch stop layer 110 (e.g., the nitride etch stop layer) remains over gate electrode 108 after etch process 132. Etch process 132 includes exposing semiconductor substrate 100 to a plasma 134 that includes a corrosive material 136 (e.g., chlorine) and a fluorine-based reducing agent (e.g. reducing agent 138). In certain embodiments, the fluorine-based reducing agent is fluorocarbon. In certain embodiments, the corrosive material includes chlorine. In certain embodiments, gate etch stop layer 110 (e.g., a nitride etch stop layer) includes silicon nitride, metal-based etch stop layer 116 includes titanium oxide, and the fluorine-based reducing agent is fluorocarbon. In certain embodiments, etch process 132 forms passivation layer 140 on gate etch stop layer 110 (e.g., a nitride etch stop layer). Passivation layer 140 may inhibit etching of gate etch stop layer 110 (e.g., the nitride etch stop layer) during etch process 132.

In certain embodiments, etch process 132 includes a single, continuous etch step to selectively etch metal-based etch stop layer 116 until the surface of source/drain contact region 114 is exposed.

In certain embodiments, etch process 132 is a multi-step etch process that includes cyclically executing the following steps until a surface of source/drain contact region 114 is exposed: forming a passivation layer 140 on a surface of gate etch stop layer 110 (e.g., the nitride etch stop layer); and etching a portion of the metal-based etch stop layer 116, passivation layer 140 inhibiting etching of gate etch stop layer 110 (e.g., the nitride etch stop layer).

At step 310, after exposing the surface of source/drain contact region 114, a conductive contact material 142 (e.g., metal) is deposited (e.g., in opening 128) to physically contact source/drain contact region 114.

At step 312, the method ends.

Figure 4:
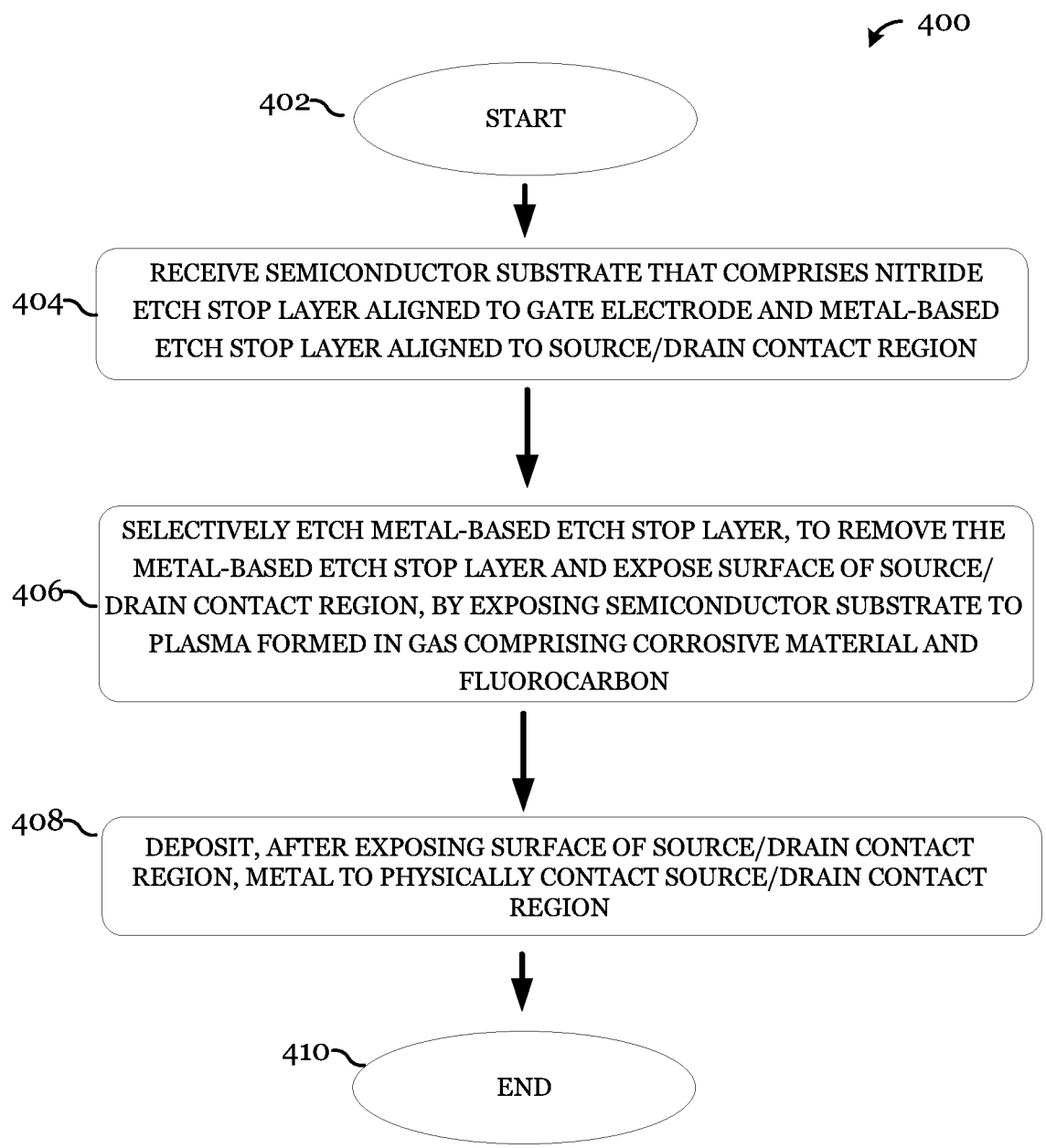
FIG. 4 illustrates an example method for processing a semiconductor substrate, according to certain embodiments of this disclosure.

FIG. 4 illustrates an example method 400 for processing semiconductor substrate 100, according to certain embodiments of this disclosure. Embodiments of method 800 could be applied to any of the embodiments described in this disclosure, as well as other suitable embodiments. The method begins as step 402.

At step 404, semiconductor substrate 100 is received. Semiconductor substrate 100 includes a nitride etch stop layer (e.g., gate etch stop layer 110) aligned to gate electrode 108 and a metal-based etch stop layer 116 aligned to a source/drain contact region 114. In certain embodiments, metal-based etch stop layer 116 includes titanium oxide, aluminum oxide, or titanium nitride. In certain embodiments, gate etch stop layer 110 (e.g., the nitride etch stop layer) includes silicon nitride.

At step 406, by exposing semiconductor substrate 100 to a plasma 134 formed in a gas that includes a corrosive material (e.g. chlorine) and fluorocarbon (or another suitable fluorine-based reducing agent), metal-based etch stop layer 116 is selectively etched to remove metal-based etch stop layer 116 and expose a surface of source/drain contact region 114.

In certain embodiments, exposing semiconductor substrate 100 to plasma 134 formed in a gas that includes a corrosive material (e.g., chlorine) and fluorocarbon (or another suitable fluorine-based reducing agent) facilitates forming passivation layer 140 on gate etch stop layer 110 (e.g., a nitride etch stop layer). Passivation layer 140 may inhibit etching of gate etch stop layer 110 (e.g., a nitride etch stop layer) during etch process 132 while exposing semiconductor substrate 100 to plasma 134 formed in the gas comprising the corrosive material and the fluorocarbon.

In certain embodiments, selectively etching metal-based etch stop layer 116, to remove metal-based etch stop layer 116 and expose the surface of source/drain contact region 114, by exposing semiconductor substrate 100 to plasma 134 is a single, continuous etch step to remove metal-based etch stop layer 116 and expose a surface of source/drain contact region 114.

At step 408, after exposing the surface of source/drain contact region 114, a conductive contact material 142 (e.g., metal) is deposited to physically contact source/drain contact region 114.

At step 410, the method ends.

Figure 5:
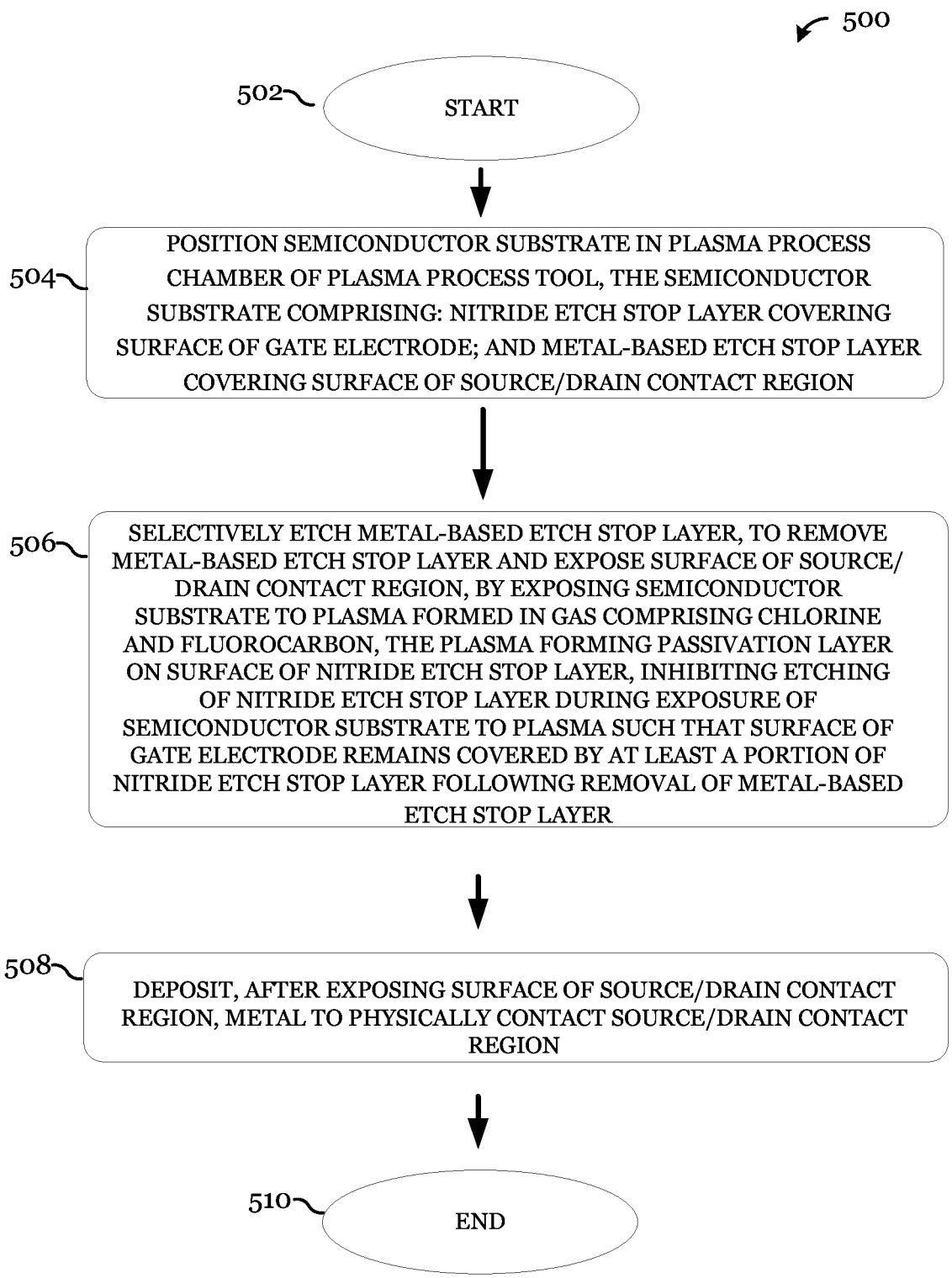
FIG. 5 illustrates an example method for processing a semiconductor substrate, according to certain embodiments of this disclosure.

FIG. 5 illustrates an example method 500 for processing semiconductor substrate 100, according to certain embodiments of this disclosure. Embodiments of method 500 could be applied to any of the embodiments described in this disclosure, as well as other suitable embodiments. The method begins as step 502.

At step 504, semiconductor substrate 100 is positioned in a plasma process chamber of a plasma process tool. Semiconductor substrate 100 includes a gate etch stop layer 110 (e.g., a nitride etch stop layer) covering a surface of gate electrode 108 and a metal-based etch stop layer 116 covering a surface of source/drain contact region 114. In certain embodiments, the plasma process tool is a capacitively-coupled plasma tool. In certain embodiments, gate etch stop layer 110 includes silicon nitride and metal-based etch stop layer 116 includes titanium oxide.

At step 506, by exposing the semiconductor substrate to a plasma 134 formed in a gas comprising chlorine and fluorocarbon, metal-based etch stop layer 116 is selectively etched to remove metal-based etch stop layer 116 and expose a surface of source/drain contact region 114. Plasma 134 forms a passivation layer 140 on a surface of gate etch stop layer 110 (e.g., a nitride etch stop layer), inhibiting etching of gate etch stop layer 110 (e.g., the nitride etch stop layer) during exposure of semiconductor substrate 100 to plasma 134 such that the surface of gate electrode 108 remains covered by at least a portion of gate etch stop layer 110 (e.g., the nitride etch stop layer) following removal of metal-based etch stop layer 116.

In certain embodiments, selectively etching metal-based etch stop layer 116, to remove metal-based etch stop layer 116 and expose the surface of source/drain contact region 114, by exposing semiconductor substrate 100 to plasma 134 formed in a gas that includes comprising a corrosive material 136 (e.g., chlorine) and a fluorine-based reducing agent 138 (e.g., fluorocarbon), includes cyclically executing, until the surface of source/drain contact region 114 is exposed, forming passivation layer 140 on a surface of gate etch stop layer 110 (e.g., a nitride etch stop layer) and etching a portion of metal-based etch stop layer 116, passivation layer 140 inhibiting etching of gate etch stop layer 110 (e.g., the nitride etch stop layer).

At step 508, after exposing the surface of source/drain contact region 114, a conductive contact material 142 (e.g., metal) is deposited (e.g., in opening 128) to physically contact source/drain contact region 114.

At step 510, the method ends.

Figure 6:
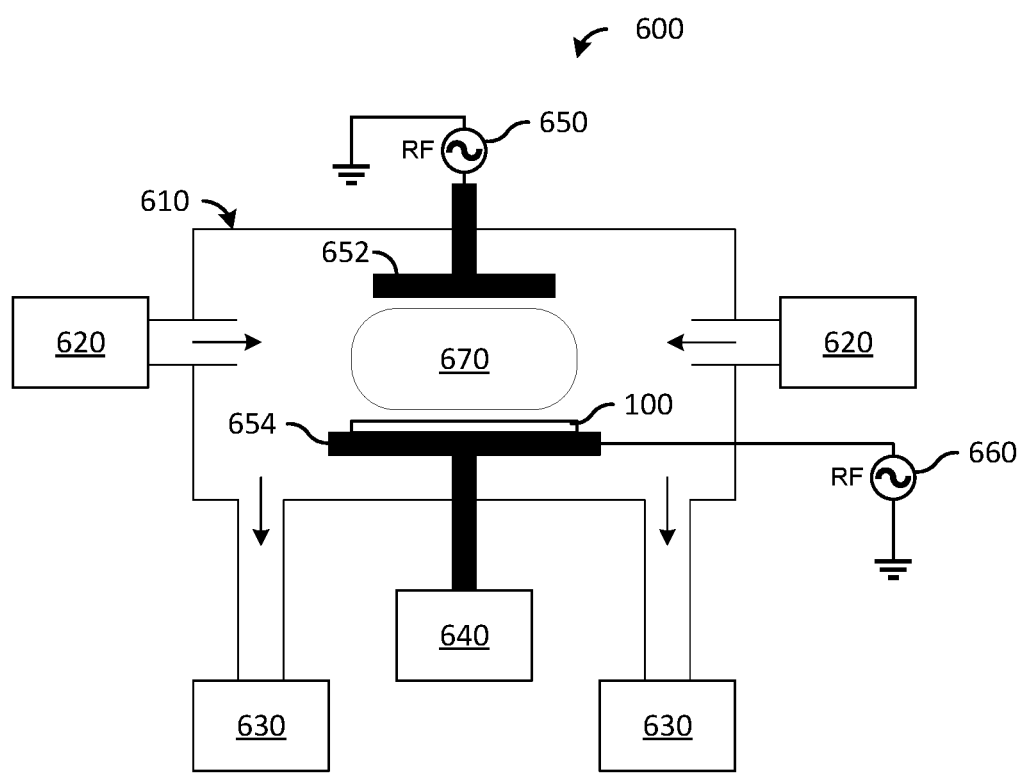
FIG. 6 illustrates a general schematic of an example plasma process system, according to certain embodiments of this disclosure.

FIG. 6 illustrates a general schematic of an example plasma process system 600, according to certain embodiments of this disclosure. Although a particular example plasma process system 600 is illustrated and described, this disclosure contemplates using any suitable type of plasma process system. Plasma process system 600 may be used to perform some or all of the plasma process steps.

Plasma process system 600 includes plasma process chamber 610, gas delivery system 620, vacuum exhaust system 630, temperature controller 640, and power sources 650 and 660. Plasma process chamber 610 includes electrode 652 and substrate holder 654.

Some or all of the steps described with respect to FIGS. 1-5 may be performed using plasma process system 600, with semiconductor substrate 100 being positioned on substrate holder 654 of plasma process chamber 610. For example, to the extent a plasma process is used to etch metal-based etch stop layer 116, semiconductor substrate 100 may be positioned in plasma process chamber 610 and exposed to a suitable plasma 370, which could be plasma 134 for example.

Gas delivery system 620, vacuum exhaust system 630, temperature controller 640, power sources 650 and 660, and electrode 652 may be programmed or otherwise operated according to desired process conditions for a given processing step. For example, to the extent a plasma process is used to etch metal-based etch stop layer 116, these components of plasma process system 600 may be set according to the example process conditions and associated parameters described in connection with etching metal-based etch stop layer 116.

Embodiments of this disclosure may provide none, some or all of the following technical advantages. Embodiments of this disclosure may provide for self-alignment of a source/drain contact etch. Certain embodiments may reduce or eliminate etching of a gate etch stop layer (e.g., over a gate electrode) when etching a metal based etch stop layer (e.g., over a source/drain contact region) to expose a surface of a source/drain contact region. This may reduce or eliminate the potential for a subsequently deposited contact material to contact both the gate electrode and the source/drain contact region, thereby reducing the possibility that a short is created in a resulting semiconductor device.

Embodiments of this disclosure may increase device yield by reducing the possibility that a short is created in a semiconductor device. Certain embodiments provide a way for metal-based etch stop layers (e.g., metal-oxide etch stop layers) to be used over source/drain contact regions, reducing or eliminating concerns that the process used to etch such metal-based etch stop layers will also expose an active surface of a gate electrode, which may be beneficial due to certain electrical properties (e.g., high breakdown voltage and/or low dielectric constant) that metal-based etch stop layers may provide. Embodiments of this disclosure may provide an improved technique for forming self-aligned gate contact integration, by reducing or eliminating problems associated with providing a self-aligned gate contact.

Although this disclosure has been described primarily using a particular type of semiconductor substrate 100, this disclosure contemplates applying similar principles and techniques to remove an etch stop layer overlying a gate contact region, a source/drain contact region, or other suitable contact region of any suitable type of substrate.

Example embodiments of the invention are summarized here. Other embodiments can also be understood from the entirety of the specification as well as the claims filed herein.

Example 1: A method for processing a semiconductor substrate includes receiving a semiconductor substrate. The semiconductor substrate includes a nitride etch stop layer over a gate electrode; a metal-based etch stop layer over a source/drain contact region, the source/drain contact region being adjacent to the gate electrode; and a dielectric layer overlying the metal-based etch stop layer and the nitride etch stop layer. The method further includes patterning, to expose respective surfaces of the metal-based etch stop layer and the nitride etch stop layer, the dielectric layer using a patterned resist layer over the dielectric layer as an etch mask. The method further includes etching the metal-based etch stop layer using a plasma etching process that selectively etches the metal-based etch stop layer until a surface of the source/drain contact region is exposed, at least a portion of the nitride etch stop layer remaining over the gate electrode after the plasma etching process. The plasma etching process includes exposing the semiconductor substrate to a plasma comprising a corrosive material and a fluorine-based reducing agent.

Example 2. The method of Example 1, where: the metal-based etch stop layer includes titanium oxide, aluminum oxide, or titanium nitride; and the nitride etch stop layer includes silicon nitride.

Example 3. The method of any one of Examples 1-2, where the plasma etching process forms a passivation layer on the nitride etch stop layer, the passivation layer inhibiting etching of the nitride etch stop layer during the plasma etching process.

Example 4. The method of any one of Examples 1-3, where: the fluorine-based reducing agent includes fluorocarbon; and the corrosive material includes chlorine.

Example 5. The method of any one of Examples 1-4, where: the nitride etch stop layer includes silicon nitride; the metal-based etch stop layer includes titanium oxide; and the fluorine-based reducing agent includes fluorocarbon.

Example 6. The method of any one of Examples 1-5, where the plasma etching process includes a single, continuous etch step to selectively etch the metal-based etch stop layer until the surface of the source/drain contact region is exposed.

Example 7. The method of any one of Examples 1-5, where the plasma etching process includes a multi-step etch process that includes cyclically executing the following steps until the surface of the source/drain contact region is exposed: forming a passivation layer on the surface of the nitride etch stop layer; and etching a portion of the metal-based etch stop layer, the passivation layer inhibiting etching of the nitride etch stop layer.

Example 8. The method of any one of Examples 1-7, where: the surface of the nitride etch stop layer is a portion of a top surface of the nitride-etch stop layer; and the surface of the metal-based etch stop layer is an entirety of a top surface of the metal-based etch stop layer.

Example 9. The method of any one of Examples 1-8, where: the semiconductor substrate further includes a spacer separating the gate electrode and the nitride etch stop layer from the source/drain contact region and the metal-based etch stop layer; and patterning the dielectric layer using the patterned resist layer over the dielectric layer as the etch mask exposes a surface of the spacer.

Example 10. The method of any one of Examples 1-9, further including depositing, after exposing the surface of the source/drain contact region, a metal to physically contact the source/drain contact region.

Example 11. The method of any one of Examples 1-10, where: the plasma further includes methane ($CH_4$); and during the plasma etching process, the methane causes a passivation layer to form on the dielectric layer overlying the metal-based etch stop layer and the nitride etch stop layer, the passivation layer inhibiting etching of the dielectric layer during the plasma etching process.

Example 12. A method for processing a semiconductor substrate, including: receiving a semiconductor substrate that includes a nitride etch stop layer aligned to a gate electrode and a metal-based etch stop layer aligned to a source/drain contact region; and selectively etching the metal-based etch stop layer, to remove the metal-based etch stop layer and expose a surface of the source/drain contact region, by exposing the semiconductor substrate to a plasma formed in a gas that includes a corrosive material and fluorocarbon.

Example 13. The method of Example 12, where the corrosive material includes chlorine.

Example 14. The method of any one of Examples 12-13, where: the metal-based etch stop layer includes titanium oxide, aluminum oxide, or titanium nitride; and the nitride etch stop layer includes silicon nitride.

Example 15. The method of any one of Examples 12-14, where exposing the semiconductor substrate to the plasma formed in a gas that includes the corrosive material and the fluorocarbon facilitates forming a passivation layer on the nitride etch stop layer, the passivation layer inhibiting etching of the nitride etch stop layer during the plasma etching process while exposing the semiconductor substrate to the plasma formed in the gas comprising the corrosive material and the fluorocarbon.

Example 16. The method of any one of Examples 12-15, where selectively etching the metal-based etch stop layer, to remove the metal-based etch stop layer and expose the surface of the source/drain contact region, by exposing the semiconductor substrate to the plasma includes a single, continuous etch step to remove the metal-based etch stop layer and expose the surface of the source/drain contact region.

Example 17. The method of Examples 12-16, further including depositing, after exposing the surface of the source/drain contact region, a metal to physically contact the source/drain contact region.

Example 18. A method for processing a semiconductor substrate includes positioning a semiconductor substrate in a plasma process chamber of a plasma process tool. The semiconductor substrate includes a nitride etch stop layer covering a surface of a gate electrode; and a metal-based etch stop layer covering a surface of a source/drain contact region. The method further includes selectively etching the metal-based etch stop layer, to remove the metal-based etch stop layer and expose the surface of the source/drain contact region, by exposing the semiconductor substrate to a plasma formed in a gas that includes chlorine and fluorocarbon, the plasma forming a passivation layer on a surface of the nitride etch stop layer, inhibiting etching of the nitride etch stop layer during exposure of the semiconductor substrate to the plasma such that the surface of the gate electrode remains covered by at least a portion of the nitride etch stop layer following removal of the metal-based etch stop layer.

Example 19. The method of Example 18, where selectively etching the metal-based etch stop layer, to remove the metal-based etch stop layer and expose the surface of the source/drain contact region, by exposing the semiconductor substrate to the plasma formed in the gas that includes chlorine and fluorocarbon, includes cyclically executing, until the surface of the source/drain contact region is exposed: forming a passivation layer on the surface of the nitride etch stop layer; and etching a portion of the metal-based etch stop layer, the passivation layer inhibiting etching of the nitride etch stop layer.

Example 20. The method of any one of Examples 18-19, where the plasma process tool is a capacitively-coupled plasma tool.

Example 21. The method of any one of Examples 18-20, where: the nitride etch stop layer includes silicon nitride; and the metal-based etch stop layer includes titanium oxide.

Although this disclosure describes or illustrates particular process/method steps as occurring in a particular order, this disclosure contemplates the process/method steps occurring in any suitable order. Moreover, this disclosure contemplates the process/method steps being repeated one or more times in any suitable order. Although this disclosure describes or illustrates particular process/method steps as occurring in sequence, this disclosure contemplates the process/method steps occurring at substantially the same time, where appropriate.

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method, comprising:
receiving a semiconductor substrate that comprises:
a nitride etch stop layer over a gate electrode;
a metal-based etch stop layer over a source/drain contact region, the source/drain contact region being adjacent to the gate electrode, the gate electrode being to a first side of the source/drain contact region, the metal-based etch stop layer covering a surface of the source/drain contact region over an entire span of the surface between the gate electrode to the first side of the source/drain contact region and another gate electrode adjacent to a second side of the source/drain contact region; and
a dielectric layer overlying the metal-based etch stop layer and the nitride etch stop layer;
patterning, to expose respective surfaces of the metal-based etch stop layer and the nitride etch stop layer, the dielectric layer using a patterned resist layer over the dielectric layer as an etch mask; and
etching the metal-based etch stop layer using a plasma etching process that selectively etches the metal-based etch stop layer until the surface of the source/drain contact region is exposed, at least a portion of the nitride etch stop layer remaining over the gate electrode after the plasma etching process, the plasma etching process comprising exposing the semiconductor substrate to a plasma comprising a corrosive material and a fluorine-based reducing agent, wherein the corrosive material comprises chlorine and the fluorine-based reducing agent comprises fluorocarbon.

2. The method of claim 1, wherein:
the metal-based etch stop layer comprises titanium oxide, aluminum oxide, or titanium nitride; and
the nitride etch stop layer comprises silicon nitride.

3. The method of claim 1, wherein the plasma etching process forms a passivation layer on the nitride etch stop layer, the passivation layer inhibiting etching of the nitride etch stop layer during the plasma etching process.

4. The method of claim 1, wherein:
the nitride etch stop layer comprises silicon nitride; and
the metal-based etch stop layer comprises titanium oxide.

5. The method of claim 1, wherein the plasma etching process comprises a single, continuous etch step to selectively etch the metal-based etch stop layer until the surface of the source/drain contact region is exposed.

6. The method of claim 1, wherein the plasma etching process comprises a multi-step etch process that includes cyclically executing the following steps until the surface of the source/drain contact region is exposed:
forming a passivation layer on the surface of the nitride etch stop layer; and
etching a portion of the metal-based etch stop layer, the passivation layer inhibiting etching of the nitride etch stop layer.

7. The method of claim 1, wherein:
the surface of the nitride etch stop layer is a portion of a top surface of the nitride etch stop layer; and
the surface of the metal-based etch stop layer is an entirety of a top surface of the metal-based etch stop layer.

8. The method of claim 1, wherein:
the semiconductor substrate further comprises a spacer separating the gate electrode and the nitride etch stop layer from the source/drain contact region and the metal-based etch stop layer; and
patterning the dielectric layer using the patterned resist layer over the dielectric layer as the etch mask exposes a surface of the spacer.

9. The method of claim 1, further comprising depositing, after exposing the surface of the source/drain contact region, a metal to physically contact the source/drain contact region.

10. The method of claim 1, wherein:
the plasma further comprises methane (CH$_4$); and
during the plasma etching process, the methane causes a passivation layer to form on the dielectric layer overlying the metal-based etch stop layer and the nitride etch stop layer, the passivation layer inhibiting etching of the dielectric layer during the plasma etching process.

11. A method, comprising:
receiving a semiconductor substrate that comprises a nitride etch stop layer aligned to a gate electrode and a metal-based etch stop layer aligned to a source/drain contact region; and
selectively etching the metal-based etch stop layer, to remove the metal-based etch stop layer and expose a surface of the source/drain contact region, by exposing the semiconductor substrate to a plasma formed in a gas comprising a corrosive material and fluorocarbon, wherein exposing the semiconductor substrate to the plasma formed in a gas comprising the corrosive material and the fluorocarbon facilitates forming a passivation layer on the nitride etch stop layer, the passivation layer inhibiting etching of the nitride etch stop layer during the plasma etching process while exposing the semiconductor substrate to the plasma formed in the gas comprising the corrosive material and the fluorocarbon.

12. The method of claim 11, wherein the corrosive material comprises chlorine.

13. The method of claim 11, wherein:
the metal-based etch stop layer comprises titanium oxide, aluminum oxide, or titanium nitride; and
the nitride etch stop layer comprises silicon nitride.

14. The method of claim 11, wherein selectively etching the metal-based etch stop layer, to remove the metal-based etch stop layer and expose the surface of the source/drain contact region, by exposing the semiconductor substrate to the plasma comprises a single, continuous etch step to remove the metal-based etch stop layer and expose the surface of the source/drain contact region.

15. The method of claim 11, further comprising depositing, after exposing the surface of the source/drain contact region, a metal to physically contact the source/drain contact region.

16. A method, comprising:
positioning a semiconductor substrate in a plasma process chamber of a plasma process tool, the semiconductor substrate comprising:
a nitride etch stop layer covering a surface of a gate electrode; and
a metal-based etch stop layer covering a surface of a source/drain contact region;
selectively etching the metal-based etch stop layer, to remove the metal-based etch stop layer and expose the surface of the source/drain contact region, by exposing the semiconductor substrate to a plasma formed in a gas comprising chlorine and fluorocarbon, the plasma forming a passivation layer on a surface of the nitride etch stop layer, inhibiting etching of the nitride etch stop layer during exposure of the semiconductor substrate to the plasma such that the surface of the gate electrode remains covered by at least a portion of the nitride etch stop layer following removal of the metal-based etch stop layer.

17. The method of claim 16, wherein selectively etching the metal-based etch stop layer, to remove the metal-based etch stop layer and expose the surface of the source/drain contact region, by exposing the semiconductor substrate to the plasma formed in the gas comprising chlorine and fluorocarbon, comprises cyclically executing, until the surface of the source/drain contact region is exposed:
forming a passivation layer on the surface of the nitride etch stop layer; and
etching a portion of the metal-based etch stop layer, the passivation layer inhibiting etching of the nitride etch stop layer.

18. The method of claim 16, wherein the plasma process tool is a capacitively-coupled plasma tool.

19. The method of claim 16, wherein:
the nitride etch stop layer comprises silicon nitride; and
the metal-based etch stop layer comprises titanium oxide.

20. The method of claim 1, wherein:
the plasma etching process comprises a reactive ion etching plasma etching process;
the plasma is generated from gases that comprise fluorocarbon, chlorine, and methane, the chlorine being provided at a greater percentage than the fluorocarbon;
the plasma etching process is performed at:
a pressure in a range of 10 mTorr to 20 mTorr;
a low frequency power in a range of 50 W to 200 W; and
a temperature of 20° C. to 80° C.

* * * * *